(12) United States Patent
Lee et al.

(10) Patent No.: US 10,048,546 B2
(45) Date of Patent: Aug. 14, 2018

(54) ARRAY SUBSTRATE AND MANUFACTURING METHOD THEREOF, LIQUID CRYSTAL DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yunbok Lee, Beijing (CN); Yuanhui Guo, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/325,051

(22) PCT Filed: Feb. 24, 2016

(86) PCT No.: PCT/CN2016/074447
§ 371 (c)(1),
(2) Date: Jan. 9, 2017

(87) PCT Pub. No.: WO2017/041448
PCT Pub. Date: Mar. 16, 2017

(65) Prior Publication Data
US 2017/0205671 A1    Jul. 20, 2017

(30) Foreign Application Priority Data

Sep. 10, 2015  (CN) .......................... 2015 1 0572775

(51) Int. Cl.
*G02F 1/1343*   (2006.01)
*G02F 1/1333*   (2006.01)

(52) U.S. Cl.
CPC .... *G02F 1/134309* (2013.01); *G02F 1/13439* (2013.01); *G02F 1/133345* (2013.01);
(Continued)

(58) Field of Classification Search
CPC .............. G02F 1/134336; G02F 2001/134372
See application file for complete search history.

(56) References Cited

U.S. PATENT DOCUMENTS

2004/0195573 A1   10/2004  Kim
2007/0052897 A1*   3/2007  Kim .................. G02F 1/133707
                                                    349/139

(Continued)

FOREIGN PATENT DOCUMENTS

CN   101101418 A   1/2008
CN   101211044 A   7/2008

(Continued)

OTHER PUBLICATIONS

International Search Report and Written Opinion in PCT/CN2016/074447 dated Jun. 15, 2016, with English translation. 14 pages.

(Continued)

*Primary Examiner* — Phu Vu
(74) *Attorney, Agent, or Firm* — Womble Bond Dickinson (US) LLP (57) ABSTRACT

Embodiments of the disclosure provide an array substrate, a method of manufacturing an array substrate, a liquid crystal display panel, and a display device. The array substrate comprises: a common electrode and a pixel electrode on a base substrate; and a passivation layer between the common electrode and the pixel electrode. The pixel electrode is a grating structure comprising a plurality of sub-pixel elec- (Continued)

trodes. The sub-pixel electrode comprises a body structure extending in a first direction, and a bending structure extending in a second direction and formed at an end portion of at least one end of the body structure. A protrusion is disposed at a joint of the body structure and the bending structure.

18 Claims, 5 Drawing Sheets

(52) U.S. Cl.
CPC ............ *G02F 2001/134345* (2013.01); *G02F 2201/121* (2013.01); *G02F 2201/123* (2013.01); *G02F 2201/30* (2013.01)

(56) References Cited

U.S. PATENT DOCUMENTS

| | | |
|---|---|---|
| 2008/0007666 A1 | 1/2008 | Takeda et al. |
| 2008/0198318 A1 | 8/2008 | Lee |
| 2010/0060838 A1 | 3/2010 | Kim et al. |
| 2012/0249940 A1 | 10/2012 | Choi et al. |
| 2014/0240629 A1* | 8/2014 | Zhou ................ G02F 1/134363 349/43 |
| 2016/0103372 A1* | 4/2016 | Qin ..................... H01L 27/3218 257/72 |

FOREIGN PATENT DOCUMENTS

| | | |
|---|---|---|
| CN | 101246289 | 8/2008 |
| CN | 102213872 | 10/2011 |
| CN | 103941485 A | 7/2014 |
| CN | 105321959 A | 2/2016 |

OTHER PUBLICATIONS

Chinese Office Action with English Language Translation, dated Oct. 10, 2017, Chinese Application No. 201510572775.0.
Office Action received for Chinese Patent Application No. 201510572775.0, dated May 16, 2018, 10 pages (4 pages of English Translation and 6 pages of Office Action).
International Preliminary Report on Patentability received for PCT Patent Application No. PCT/CN2016/074447, dated Mar. 22, 2018, 13 pages (8 pages of English Translation and 5 pages of Original Document).

\* cited by examiner

ARRAY SUBSTRATE AND MANUFACTURING METHOD THEREOF, LIQUID CRYSTAL DISPLAY PANEL AND DISPLAY DEVICE

TECHNICAL FIELD

The disclosure relates to the field of liquid crystal display, specifically to the field of liquid crystal display using advanced super dimension switch (ADS) technology.

BACKGROUND

The ADS technology is a core technology represented by wide viewing angle technology. The core technology thereof is described as: constituting a multi-dimensional electric field by the electric field generated at the edge of the pixel electrode and the electric field generated between the pixel electrode and the common electrode, so that liquid crystal molecules in all orientations between the pixel electrodes and above the pixel electrodes in the liquid crystal cell can be rotated, thereby increasing viewing angle of the display image greatly. The ADS technology mainly has four characteristics: hard screen, super wide viewing angle, ultra-high speed motion picture processing, and perfect color.

However, in the existing field of liquid crystal display using the ADS technology, in the event that the driving voltage applied on the transparent electrically conductive film electrode (for example, the common electrode and the pixel electrode) rises, or the driving condition changes, e.g. high temperature, or a finger presses the liquid crystal screen, it would result in occurrence of disclination or reverse tilt at the edge of the transparent electrically conductive film electrode, particularly the pixel electrode.

SUMMARY

Therefore, it is desired to provide an array substrate, a method of manufacturing an array substrate, a liquid crystal display panel, and a display device, which can solve or at least mitigate at least part of defects existing in the prior art.

According to a first aspect of the disclosure, an array substrate is provided, comprising: a common electrode and a pixel electrode on a base substrate; a passivation layer between the common electrode and the pixel electrode. The pixel electrode is a grating structure comprising a plurality of sub-pixel electrodes. The sub-pixel electrode comprises a body structure extending in a first direction, and a bending structure extending in a second direction and formed at an end portion of at least one end of the body structure, and a protrusion is disposed at a joint of the body structure and the bending structure.

Protrusions are formed at joints of the body structures and the bending structures of the sub-pixel electrodes. These areas where the protrusions are formed usually correspond to the areas in the vicinity of which thin film transistors exist. In this way, in the event that the driving voltage of the array substrate rises, or the driving condition changes e.g., high temperature, or the finger presses the liquid crystal screen, disclination or reverse tilt of liquid crystal molecules does not occur at the edges of the sub-pixel electrodes because the structure of the array substrate has been stable. Therefore, the liquid crystal molecules in the liquid crystal layer within the pixel area comprising the pixel electrode and the common electrode do not have Trace Mura phenomenon caused by disclination or reverse tilt of the liquid crystal molecules, which ensures the display effect of the array substrate and the liquid crystal panel.

In an embodiment of the disclosure, the plurality of sub-pixel electrodes are parallel with each other.

In another embodiment of the disclosure, the bending structure comprises a first bending structure extending in the second direction and formed at an end portion of one end of the body structure, and a second bending structure extending in the second direction and formed at an end portion of the other end of the body structure. The protrusion is disposed at an outer side of joint of the body structure and the first bending structure of at least one of the sub-pixel electrodes, and/or the protrusion is disposed at an outer side of joint of the body structure and the second bending structure of at least one of the sub-pixel electrodes. The outer side of the joint of the body structure and the bending structure is a side of the joint opposite to a bending direction of the bending structure.

In a further embodiment of the disclosure, the protrusion is disposed at an outer side of joint of the body structure and the first bending structure of each of the sub-pixel electrodes, and at an outer side of joint of the body structure and the second bending structure of each of the sub-pixel electrodes.

In an embodiment of the disclosure, the protrusion disposed at the outer side of the joint of the body structure and the first bending structure of each of the sub-pixel electrodes faces towards one direction, and the protrusion disposed at the outer side of the joint of the body structure and the second bending structure of each of the sub-pixel electrodes faces towards another direction. The protrusion at the outer side of the joint of the body structure and the first bending structure of the sub-pixel electrode and the protrusion at the outer side of the joint of the body structure and the second bending structure of the sub-pixel electrode face towards opposite directions.

In another embodiment of the disclosure, a profile of the protrusion is in Λ shape or arc shape.

According to another embodiment, the common electrode is located under the pixel electrode.

According to another embodiment, the common electrode and the pixel electrode are both transparent electrically conductive film electrodes.

According to a second aspect of the disclosure, a method of manufacturing an array substrate is provided, comprising the steps of: forming a common electrode and a pixel electrode on a base substrate, and a passivation layer between the common electrode and the pixel electrode, wherein the pixel electrode is a grating structure comprising a plurality of sub-pixel electrodes, and the sub-pixel electrode comprises a body structure extending in a first direction, and a bending structure extending in a second direction and formed at an end portion of at least one end of the body structure, and forming a protrusion at a joint of the body structure and the bending structure.

Protrusions are formed at joints of the body structures and the bending structures of the sub-pixel electrodes. These areas where the protrusions are formed usually correspond to the areas in the vicinity of which thin film transistors exist. In this way, in the event that the driving voltage of the array substrate rises, or the driving condition changes e.g., high temperature, or the finger presses the liquid crystal screen, disclination or reverse tilt of liquid crystal molecules does not occur at the edges of the sub-pixel electrodes because the structure of the array substrate has been stable. Therefore, the liquid crystal molecules in the liquid crystal layer within the pixel area comprising the pixel electrode and the common electrode do not have Trace Mura phenomenon caused by disclination or reverse tilt of the liquid crystal molecules, which ensures the display effect of the array substrate and the liquid crystal panel.

In an embodiment of the disclosure, the plurality of sub-pixel electrodes are parallel with each other.

In another embodiment of the disclosure, the bending structure comprises a first bending structure extending in the second direction and formed at an end portion of one end of the body structure, and a second bending structure extending in the second direction and formed at an end portion of the other end of the body structure. The step of forming a protrusion at the joint of the body structure and the bending structure comprises: forming a protrusion at an outer side of joint of the body structure and the first bending structure of at least one of the sub-pixel electrodes, and/or forming a protrusion at an outer side of joint of the body structure and the second bending structure of at least one of the sub-pixel electrodes. The outer side of the joint of the body structure and the bending structure is a side of the joint opposite to a bending direction of the bending structure.

In a further embodiment of the disclosure, the step of forming a protrusion at the joint of the body structure and the bending structure comprises: forming protrusions at an outer side of joint of the body structure and the first bending structure of each of the sub-pixel electrodes and at an outer side of joint of the body structure and the second bending structure of each of the sub-pixel electrodes.

In an embodiment of the disclosure, the protrusion disposed at the outer side of the joint of the body structure and the first bending structure of each of the sub-pixel electrodes faces towards one direction, and the protrusion disposed at the outer side of the joint of the body structure and the second bending structure of each of the sub-pixel electrodes faces towards another direction. The protrusion at the outer side of the joint of the body structure and the first bending structure of the sub-pixel electrode and the protrusion at the outer side of the joint of the body structure and the second bending structure of the sub-pixel electrode face towards opposite directions.

According to another embodiment, a profile of the protrusion is in Λ shape or arc shape.

According to another embodiment, the step of forming a common electrode and a pixel electrode on a base substrate comprises: forming a common electrode on a base substrate and forming a pixel electrode above the common electrode.

According to another embodiment, the common electrode and the pixel electrode are both transparent electrically conductive film electrodes.

According to a third aspect of the disclosure, a liquid crystal display panel is provided, comprising an array substrate as stated above, and further comprising a counter substrate and a liquid crystal layer between the array substrate and the counter substrate. The pixel electrode and the common electrode are adapted to form an electric field to drive liquid crystal molecules of the liquid crystal layer to rotate.

According to a fourth aspect of the disclosure, a display device is provided, comprising a liquid crystal display panel as stated above.

DETAILED DESCRIPTION OF THE INVENTION

Next, the embodiments of the disclosure will be described in detail with reference to all drawings.

The directional terms such as "above", "lower left", "upper left", "upper right", "lower right" mentioned in the subsequent descriptions of the disclosure make reference to the directions as shown in the drawings. These directional terms should also have corresponding meanings in other cases, and have no limiting significance.

Figure 1A:
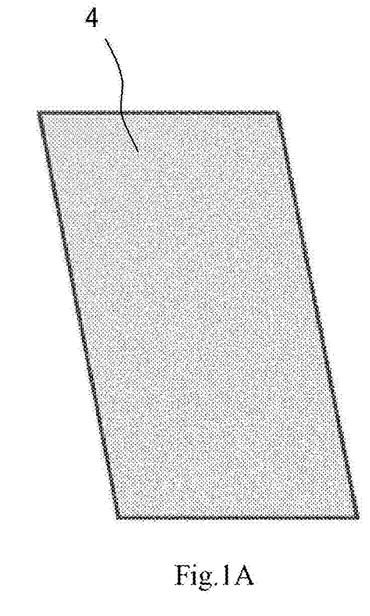
FIG. 1A schematically shows a common electrode used in an array substrate.
Figure 1B:
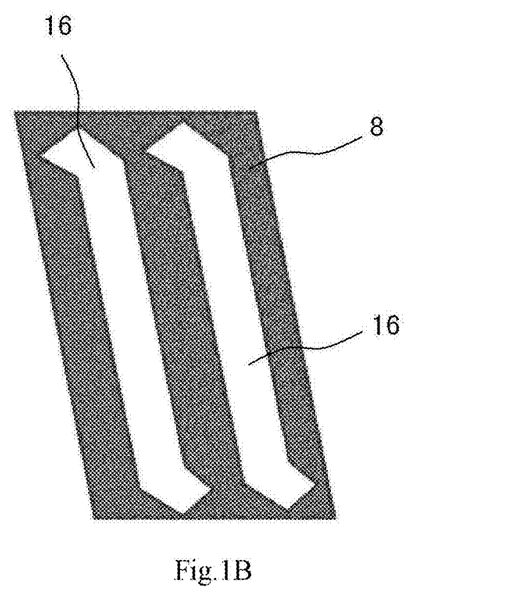
FIG. 1B schematically shows a pixel electrode used in an array substrate.
Figure 1C:
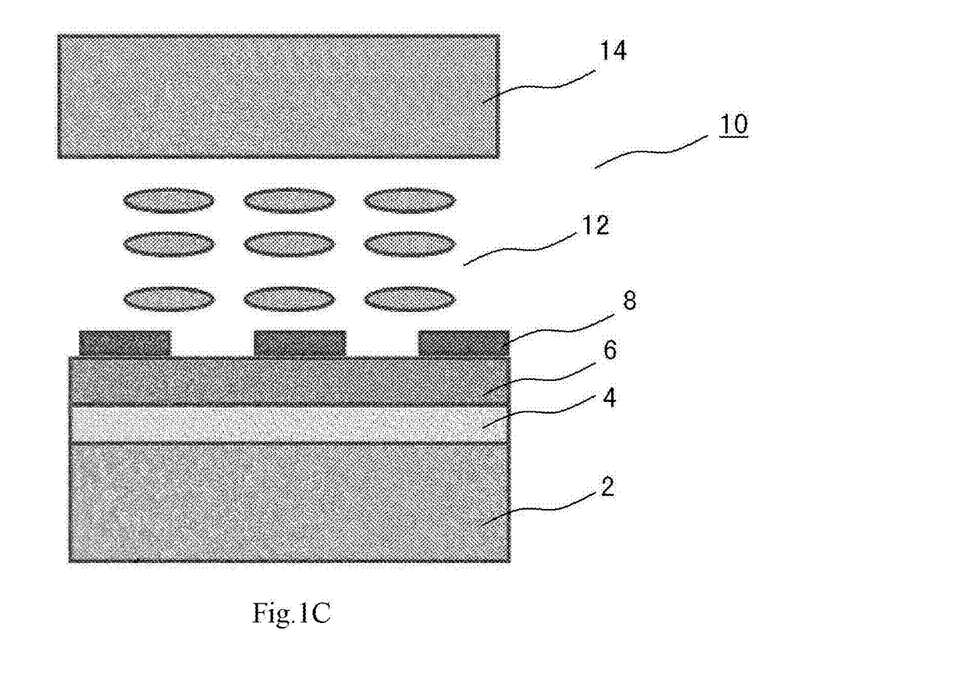
FIG. 1C schematically shows a structural view of an array substrate.
Figure 2:
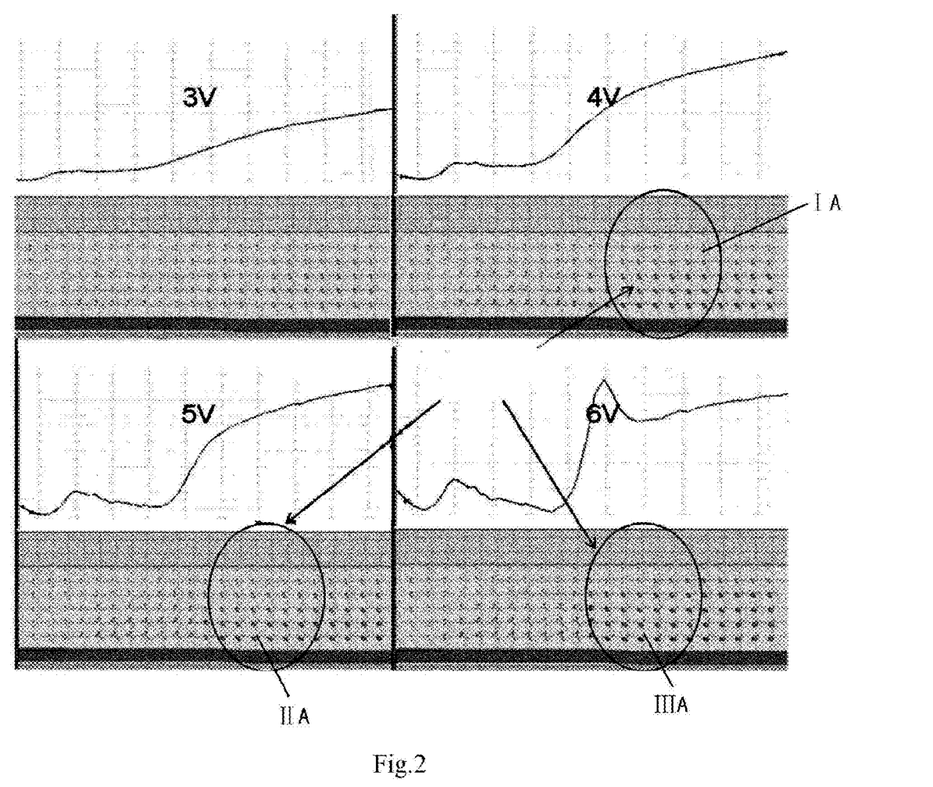
FIG. 2 schematically shows a state diagram of liquid crystal molecules in the liquid crystal layer in case of using driving voltages of 3V, 4V, 5V and 6V to perform simulation for the electrode arrangement as shown in FIG. 1.

FIG. 1A schematically shows a common electrode 4 used in an array substrate using the ADS technology. FIG. 1B schematically shows a pixel electrode 8 used in an array substrate using the ADS technology. In the field of liquid crystal display using the ADS technology, the Indium tin oxide pixel electrode can be designed in a shape as shown in FIG. 1B. The sub-pixel electrodes in the pixel electrode 8 are separated with gaps 16. FIG. 1B only schematically shows two gaps 16. As shown in the figure, the sub-pixel electrodes of the pixel electrode 8 are substantially parallel with each other, and are separated with regular gaps, for example, separated with the gaps 16 in FIG. 1B. FIG. 1C schematically shows a structural view of an array substrate 10 using the ADS technology. The structural view of the array substrate as shown in FIG. 1C shows a base substrate 2, a common electrode 4 on the base substrate 2, a pixel electrode 8 above the common electrode 4, a passivation layer 6 between the common electrode 4 and the pixel electrode 8, liquid crystal layers 12 between and above the pixel electrodes 8, a color filter 14 above the liquid crystal layer 12. FIG. 2 schematically shows a state diagram of liquid crystal molecules in the liquid crystal layer in case of using driving voltages of 3V, 4V, 5V and 6V to perform simulation for the pixel electrode arrangement as shown in FIG. 1B. When the applied driving voltage is 3V, the reverse tilt area or the disclination area has not come up yet, however, with the increase of the driving voltage, when the applied driving voltage is 4V, 5V and 6V, the reverse tilt area or the disclination area comes up, as shown by the elliptic parts IA, IIA, IIIA in FIG. 4. These areas where disclination or reverse tilt is generated result in the display characteristics variation to form Trace Mura.

When no driving voltage is applied on the common electrode 4 and the pixel electrode 8 (shown in FIG. 1C), the liquid crystal molecules in the liquid crystal layer 12 are arranged in good order. The orientation state of the liquid crystal molecules is continuous and stable. When the applied driving voltage exceeds the threshold voltage, the liquid crystal molecules in the liquid crystal layer 12 begin to rotate along the direction of the electric field, and the orientation state of the liquid crystal molecules at this time is still continuous. However, when the voltage is increased further, the liquid crystal molecules continue to rotate along the direction of the electric field. Then, the orientation state of the liquid crystal molecules in some areas becomes discontinuous, i.e., disclination or reverse tilt is generated. For example, FIG. 2 schematically shows a state diagram of liquid crystal molecules in the liquid crystal layer in case of using driving voltages of 3V, 4V, 5V and 6V to perform simulation for the electrode arrangement as shown in FIG. 1C. When the applied voltage is 4V, 5V or 6V, the disclination or reverse tilt area comes up, as shown by the elliptic parts IA, IIA, IIIA in FIG. 2. These areas where disclination or reverse tilt is generated result in the display characteristics variation to form Trace Mura, which influences the display effect of the liquid crystal panel.

Figure 3A:
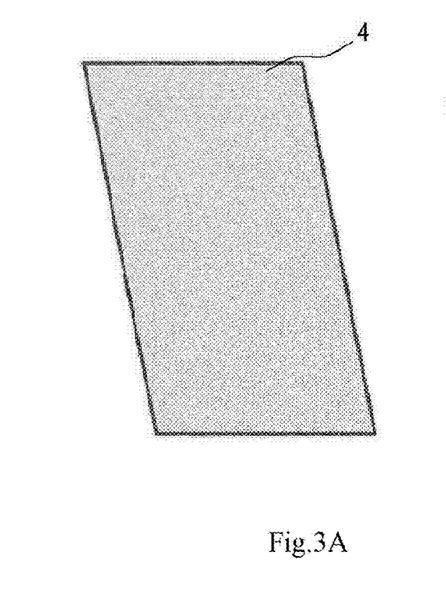
FIG. 3A schematically shows a common electrode used in an array substrate according to an embodiment of the disclosure.
Figure 3B:
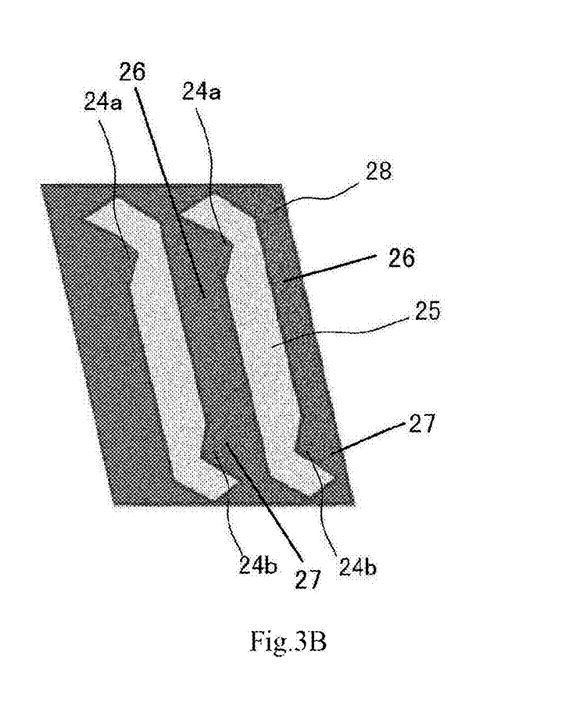
FIG. 3B schematically shows an improved pixel electrode used in an array substrate according to an embodiment of the disclosure.
Figure 3C:
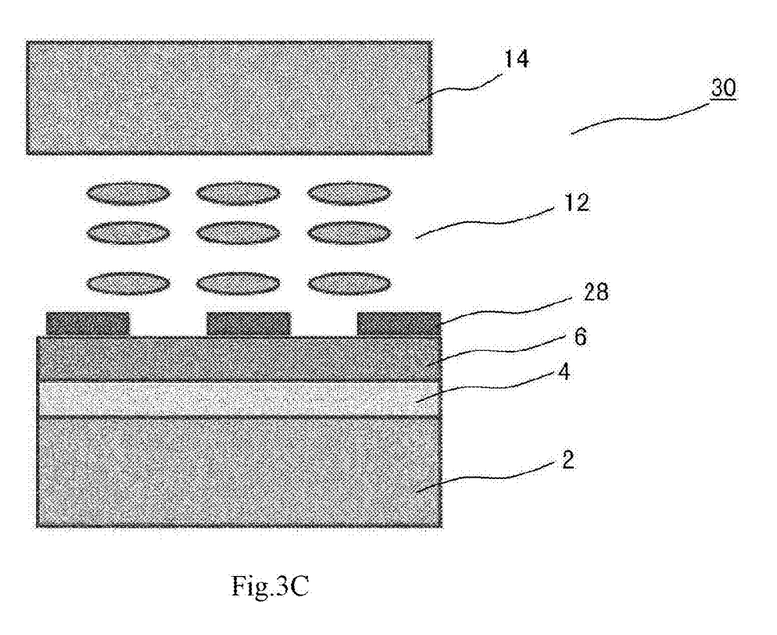
FIG. 3C schematically shows a structural view of an array substrate according to an embodiment of the disclosure.

According to a first aspect of the disclosure, an array substrate 30 is provided, as shown in FIG. 3C. FIG. 3C schematically shows a structural view of an array substrate according to an embodiment of the disclosure. The array substrate 30 can comprise: a common electrode 4 and a pixel electrode 28 on a base substrate 2, and a passivation layer 6 between the common electrode 4 and the pixel electrode 28. The pixel electrode 28 is a grating structure comprising a plurality of sub-pixel electrodes. The sub-pixel electrode comprises a body structure 26 extending in a first direction, and a bending structure extending in a second direction and formed at an end portion of at least one end of the body structure. Protrusions 24a, 24b are disposed at joints of the body structure 26 and the bending structures.

According to another embodiment, the bending structure can comprise a first bending structure, for example an upper bending structure 27', extending in the second direction and formed at an end portion of one end of the body structure 26, and a second bending structure, for example a lower bending structure 27, extending in the second direction and formed at an end portion of the other end of the body structure 26, as further described later with reference to FIG. 4B.

FIG. 3A schematically shows a common electrode 4 used in an array substrate 30 according to an embodiment of the disclosure. FIG. 3B schematically shows an improved pixel electrode 28 used in an array substrate 30 according to an embodiment of the disclosure. For the convenience of description, the gaps between the sub-pixel electrodes of the pixel electrode 28 as shown in FIG. 3B are represented by 25. FIG. 3B only shows two gaps 25 between three sub-pixel electrodes. Every two adjacent sub-pixel electrodes are separated by a gap 25. That is, a plurality of sub-pixel electrodes constitute the pixel electrode 28. The three sub-pixel electrodes shown in FIG. 3B are only schematic. If needed, the pixel electrode 28 can comprise a plurality of sub-pixel electrodes. The sub-pixel electrodes of the pixel electrode 28 can be substantially parallel with each other and are separated with regular gaps, for example, with gaps 25 in FIG. 3B. FIG. 3B further shows protrusions 24a, 24b formed at the joints of the body structure 26 and the bending structures. The protrusion formed at the joint of the upper bending structure and the body structure 26 in FIG. 3B is called 24a (the upper bending structure 27' is shown in FIG. 4B), and the protrusion formed at the joint of the lower bending structure 27 and the body structure 26 is called 24b. Here, the bending structures of each sub-pixel electrode of the pixel electrode 28 are divided into the upper bending structure 27' and the lower bending structure 27 for the convenience of description. The upper bending structure 27' and the lower bending structure 27 extending along the second direction as shown in FIG. 5B are also substantially parallel with each other.

The profiles of the protrusions as shown in FIG. 3B are Λ shaped protrusions 24a, 24b. These protrusions are in the same plane as each sub-pixel electrode of the pixel electrode 28, but they occupy the space of the gaps 25. In other words, it seems that the gap 25 has a triangular notch at the end portion. FIG. 3B shows two Λ shaped protrusions 24a and two Λ shaped protrusions 24b. In other words, each gap 25 has triangular notches at the upper end and the lower end. FIG. 3B shows four triangular notches. In an embodiment of the disclosure, in the event that the profiles of the protrusions are Λ shaped protrusions 24a, 24b, the top angles of the Λ shaped protrusions 24a, 24b are equal to or above 30°, for example.

According to another embodiment, the protrusions 24a, 24b as shown can also be arc shaped protrusions. The profiles of the protrusions as shown in FIGS. 3B, 4A, 4B are all Λ shaped protrusions. The protrusions as shown in FIG. 5 are all arc shaped protrusions 24a', 24b'. According to another embodiment, the arc shaped protrusions 24a', 24b' can also be part of a circle, i.e., circular arc protrusions. Similarly, these arc shaped protrusions 24a', 24b' or the circular arc protrusions are in the same plane as each sub-pixel electrode of the pixel electrode 28, but they occupy the space of the gap 25. In other words, it seems that the gap 25 has an arc shaped notch at the end portion. FIG. 5 shows two arc shaped protrusions 24a' and two arc shaped protrusions 24b'. In other words, each gap 25 has arc shaped notches at the upper end and the lower end. FIG. 5 shows four arch shaped notches. The arc shaped protrusions 24a', 24b' will be described in detail below.

Figures 4A, 4B:
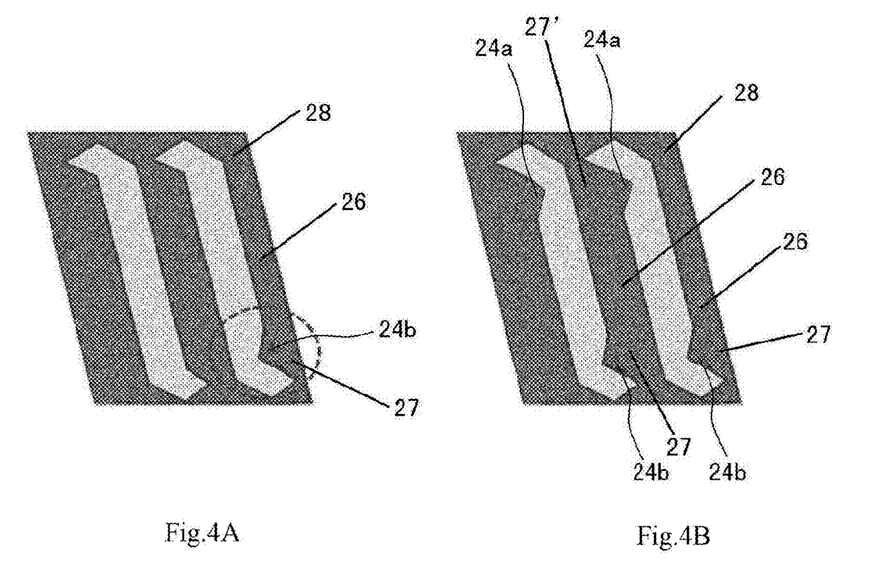
FIG. 4A schematically shows an improved pixel electrode according to an embodiment of the disclosure.
FIG. 4B schematically shows an improved pixel electrode according to another embodiment of the disclosure.
Figure 5:
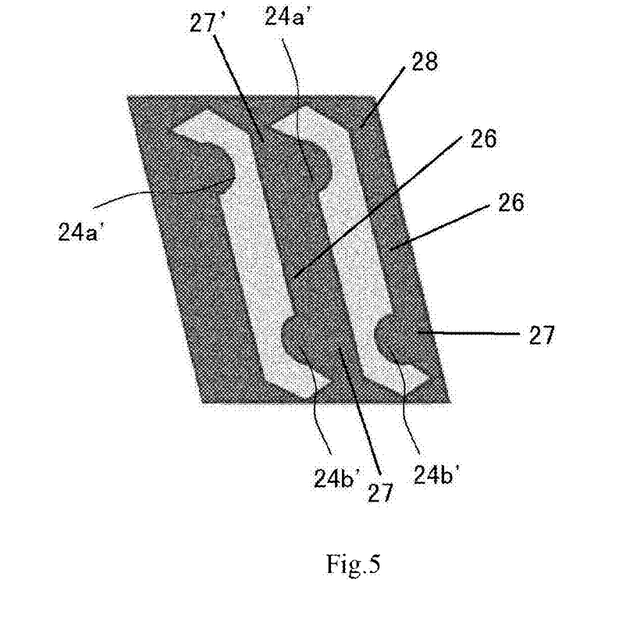
FIG. 5 schematically shows an improved pixel electrode according to a further embodiment of the disclosure.

FIG. 4A schematically shows an improved pixel electrode 28 according to an embodiment of the disclosure. The protrusion can be disposed at an outer side of joint of the body structure 26 and the upper bending structure of each sub-pixel electrode, and the protrusion 24b can also be disposed at an outer side of joint of the body structure 26 and the lower bending structure of each sub-pixel electrode. The outer side of the joint of the body structure 26 and the upper or lower bending structure is a side of the joint opposite to the bending direction of the bending structure. FIG. 4A only schematically shows the case in which the protrusion 24b is disposed at the outer side of the joint of the body structure 26 and the lower bending structure of one of the sub-pixel electrodes.

It should be pointed out that the term "outer side" refer to a side of the joint of the body structure 26 and the upper or lower bending structure opposite to the bending direction of the bending structure. Take the three sub-pixel electrodes as shown in FIG. 4B as the example, the lower bending structure 27 bends towards the lower right direction as illustrated relative to the joint of the body structure 26 and the bending structure 27. The protrusion 24b is formed at a side opposite to the lower right bending direction, i.e., the upper left direction of the joint of the body structure 26 and the bending structure 27. Similarly, take the three sub-pixel electrodes as shown in FIG. 4B as the example, the upper bending structure 27' bends towards the upper left direction relative to the joint of the body structure 26 and the bending structure 27'. The protrusion 24a is formed at a side opposite to the upper left bending direction, i.e., the lower right direction of the joint of the body structure 26 and the bending structure 27'. It should be noted that the directions such as "upper left", "lower right" are all directions relative to the joint of the body structure and the bending structure as shown in the drawing, which is only directed to the embodiment as shown in FIG. 4B. In actual design, it can also be set as other directions such as "lower left", "upper right". The so-called "joint" can refer to the transition of the extending directions of the body structure and the bending structure. In addition, the extending direction of the body part as shown in the drawing is the direction rotating from a vertical direction with an angle less than 90 degrees in the counter clockwise direction, and the extending direction of the upper bending part and the lower bending part is a direction further rotating with an angle less than 90 degrees in the counter clockwise direction relative to the body part. In actual setting, the extending directions of the body part and the bending part can also be set in other ways. For example, the extending direction of the body part is the direction rotating from a vertical direction with an angle less than 90 degrees in the clockwise direction, and the extending direction of the upper bending part and the lower bending part is a direction further rotating with an angle less than 90 degrees relative to the body part. According to another embodiment, the extending direction of the body structure is a direction rotating with a certain angle relative to the horizontal direction. The rotating angle and the rotating direction can also be in other forms, which will not be defined in embodiments of the disclosure. The above angles and directions and so on are all for describing the embodiments of the disclosure more clearly rather than limitations to the disclosure.

Similarly, the profile of the protrusion as shown in FIG. 4A is not limited to the Λ shaped protrusion 24b, which can also be an arc shaped protrusion or a circular arc protrusion. Certainly, it can also be a protrusion in other shapes such as strip, circular, and irregular shape etc., which will not be defined in embodiments of the disclosure.

According to another embodiment, the Λ shaped protrusion can also be only disposed at the outer side (not shown in FIG. 4A) of the joint of the body structure 26 and the upper bending structure 27' of one sub-pixel electrode of the pixel electrode 28. According to another embodiment, the Λ shaped protrusions can also be disposed at the outer side of the joints of the body structure 26 and the upper bending structure 27', the lower bending structure 27 of each sub-pixel electrode of the pixel electrode 28. FIG. 4B shows that protrusions 24a and 24b are formed at the upper part and the lower part of the middle sub-pixel electrode of the three sub-pixel electrodes of the pixel electrode 28, i.e., both the outer side of the joint of the body structure 26 and the upper bending structure 27' and the outer side of the joint of the body structure 26 and the lower bending structure 27. That is, protrusions are formed at both the outer side of the joint of the body structure 26 and the upper bending structure 27' and the outer side of the joint of the body structure 26 and the lower bending structure 27. All protrusions at the outer sides of the joints of the body structures 26 and the upper bending structures 27' face towards one direction, and all protrusions at the outer sides of the joints of the body structures 26 and the lower bending structures 27 face towards the opposite direction. For example, as shown in FIG. 4B, the protrusions at the outer sides of the joints of the body structures 26 and the upper bending structures 27' of the sub-pixel electrodes, i.e., the protrusions at the upper parts of the sub-pixel electrodes all face towards the right side of the body structures 26. The protrusions at the outer sides of the joints of the body structures 26 and the lower bending structures 27, i.e., the protrusions at the lower parts of the sub-pixel electrodes all face towards the left side of the body structures 26. The so-called "face towards" refers to a direction which the pointed end of the Λ shaped protrusion or the curved surface of the arc shaped protrusion points to. It should be noted that the left side and the right side directions of the body structure have been defined for the convenience of describing, which are not the definitions of the specific directions thereof. It can be regarded as the left side direction as long as the whole direction includes a direction towards the left side, for example, upper left or lower left. Similarly, it can be regarded as the right side direction as long as the whole direction includes a direction towards the right side, for example, upper right or lower right.

FIG. 5 schematically shows an improved pixel electrode 28 according to a further embodiment of the disclosure, in which it schematically shows that a bending structure, for example the upper bending structure 27', is disposed at one end of the body structure 26 of each sub-pixel electrode of the pixel electrode 28, and another bending structure, for example the lower bending structure 27, is disposed at the other end of the body structure 26. Arc shaped protrusions are disposed at the outer side of the joint of the body structure 26 and each upper bending structure 27' and the outer side of the joint of the body structure 26 and the lower bending structure 27, for example, the arc shaped protrusion 24a' at the outer side of the joint of the upper bending structure 27' and the arc shaped protrusion 24b' at the outer side of the joint of lower bending structure 27. FIG. 5 only schematically shows two arc shaped protrusions 24a' and two arc shaped protrusions 24b'. If needed, the number of these arc shaped protrusions is not limited.

In FIG. 4B and FIG. 5, the protrusions at the outer sides of the joints of the body structures 26 and one type of bending structures (for example the lower bending structures 27) face towards one direction. For example, the Λ shaped protrusions 24b in FIG. 4B and the arc shaped protrusions 24b' in FIG. 5 can all be regarded as facing towards the left side direction. The protrusions at the outer sides of the joints of the body structures 26 and another type of bending structures (for example the upper bending structures 27') face towards an opposite direction. For example, the Λ shaped protrusions 24a in FIG. 4B and the arc shaped protrusions 24a' in FIG. 5 all face towards the right side direction. That is, the protrusions at the upper end and the lower end of each sub-pixel electrode of the pixel electrode 28 face towards opposite directions, no matter the profile of the protrusion is a Λ shaped protrusion or an arc shaped protrusion or a circular arc protrusion. For example, FIG. 4B and FIG. 5 show that the protrusions formed at the upper end and the lower end of the middle sub-pixel electrode in the three sub-pixel electrodes of the pixel electrode 28 face towards opposite directions.

According to another embodiment, the common electrode 4 is located under the pixel electrode 28.

According to another embodiment, the common electrode 4 and the pixel electrode 28 are both transparent electrically conductive film electrodes.

Figure 6:
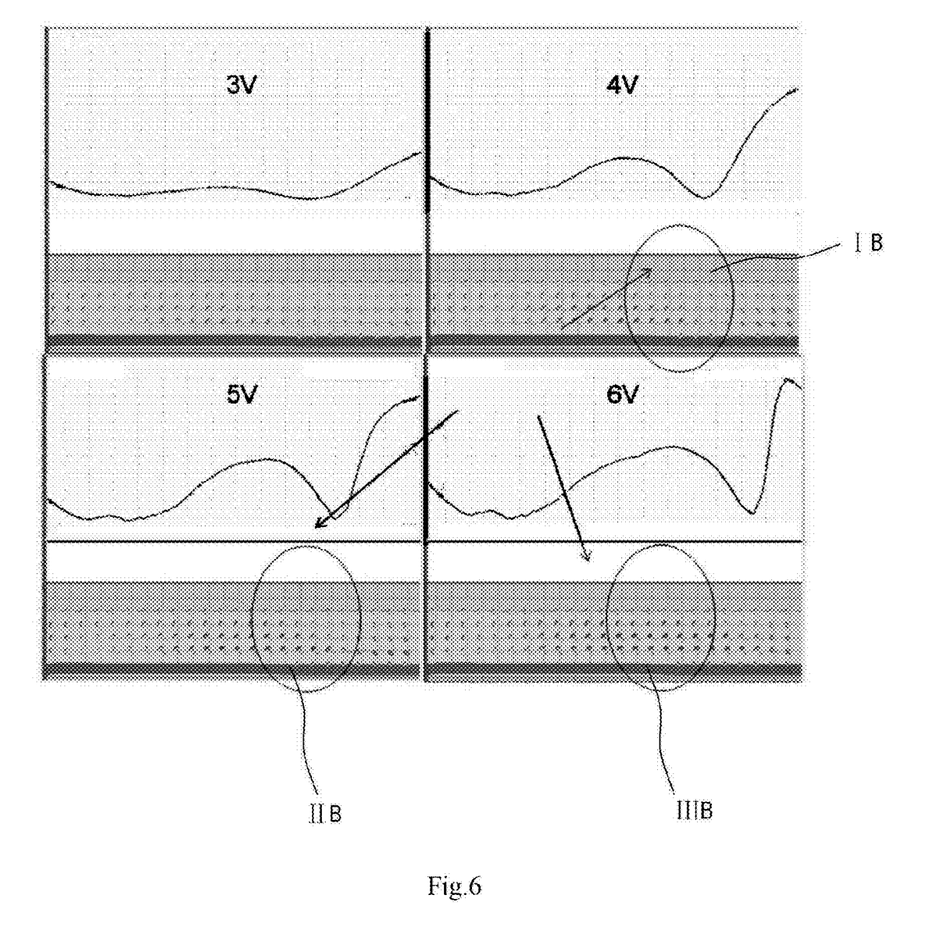
FIG. 6 schematically shows a state diagram of liquid crystal molecules in the liquid crystal layer in case of using driving voltages of 3V, 4V, 5V and 6V to perform simulation for the improved electrode arrangement as shown in FIG. 4A.

The inventor, after designing the above pixel electrode 28, with respect to the design structure in FIG. 4A that Λ shaped protrusion is formed at the lower end of one sub-pixel electrode of the pixel electrode 28, applies a driving voltage to the common electrode 4 and the pixel electrode 28 of the array substrate to perform simulation experiment, and observes the state of the liquid crystal molecules of the liquid crystal layer 12 when the applied driving voltage is 3V, 4V, 5V and 6V respectively. FIG. 6 shows such a simulation result. From the result of FIG. 6 it can be seen that when the applied driving voltage is 3V, the reverse tilt area or the disclination area does not come up. With the increase of the driving voltage, when the applied driving voltage is increased to 4V, 5V and 6V, the reverse tilt area or the disclination area still does not come up. The directors of the liquid crystal molecules of the liquid crystal layer 12 in the areas as shown by the elliptic parts IB, IIB, IIIB do not change. In other words, the liquid crystal molecules of the liquid crystal layer 12 substantially all stand up towards the head direction of the liquid crystal molecules. That is, the case that the directors of the liquid crystal molecules in one area of the liquid crystal layer 12 face towards one direction while the directors of the liquid crystal molecules in another area of the liquid crystal layer 12 face towards another direction does not occur. By means of the design solution in FIG. 4A of the disclosure, when the applied driving voltage is 3V, 4V, 5V and 6V, the reverse tilt area or the disclination area of the liquid crystal molecules does not come up, and the Trace Mura does not come up in the image display with the array substrate, thereby ensuring the display effect of the array substrate.

The inventor has recognized that, forming a protrusion at the joint of the body structure and the bending structure of the pixel electrode, particularly forming a protrusion in the vicinity of an area where a thin film transistor exists, can suppress disclination of the liquid crystal molecules in the liquid crystal layer.

The common electrode 4 and the pixel electrode 28 used in the above embodiments can both transparent electrically conductive film electrodes, e.g., indium tin oxide (ITO) electrodes, or aluminum-doped zinc oxide (AZO) electrodes etc.

According to a second aspect of the disclosure, a flow chart of manufacturing an array substrate is provided, which can comprise the steps of: forming a common electrode and a pixel electrode on a base substrate, and a passivation layer between the common electrode and the pixel electrode. The pixel electrode is a grating structure comprising a plurality of sub-pixel electrodes, and the sub-pixel electrode comprises a body structure extending in a first direction, and a bending structure extending in a second direction and formed at an end portion of at least one end of the body structure. Forming a common electrode and a pixel electrode on the base substrate comprises forming a protrusion at a joint of the body structure and the bending structure.

In an embodiment of the disclosure, the plurality of sub-pixel electrodes are parallel with each other.

In another embodiment of the disclosure, the bending structure comprises a first bending structure extending in the second direction and formed at an end portion of one end of the body structure, and a second bending structure extending in the second direction and formed at an end portion of the other end of the body structure.

In a further embodiment of the disclosure, the step of forming a protrusion at the joint of the body structure and the bending structure comprises:

forming a protrusion at an outer side of joint of the body structure and the first bending structure of at least one of the sub-pixel electrodes, and/or forming a protrusion at an outer side of joint of the body structure and the second bending structure of at least one of the sub-pixel electrodes. The outer side of the joint of the body structure and the bending structure is a side of the joint opposite to a bending direction of the bending structure.

According to another embodiment, the step of forming a protrusion at the joint of the body structure and the bending structure comprises:

forming protrusions at an outer side of joint of the body structure and the first bending structure of each of the sub-pixel electrodes and at an outer side of joint of the body structure and the second bending structure of each of the sub-pixel electrodes.

According to another embodiment, the protrusion disposed at the outer side of the joint of the body structure and the first bending structure of each of the sub-pixel electrodes faces towards one direction, and the protrusion disposed at the outer side of the joint of the body structure and the second bending structure of each of the sub-pixel electrodes faces towards another direction. The protrusion at the outer side of the joint of the body structure and the first bending structure of the sub-pixel electrode and the protrusion at the outer side of the joint of the body structure and the second bending structure of the sub-pixel electrode face towards opposite directions. The specific structure thereof is similar as the preceding embodiment, which will not be repeated here.

According to another embodiment, a profile of the protrusion is in Λ shape or arc shape.

According to another embodiment, the step of forming a common electrode and a pixel electrode on a base substrate comprises: forming a common electrode on a base substrate and forming a pixel electrode above the common electrode.

According to another embodiment, the common electrode and the pixel electrode are both made from transparent electrically conductive film materials, e.g., indium tin oxide (ITO) electrodes, or aluminum-doped zinc oxide (AZO) electrodes etc.

According to a third aspect of the disclosure, a liquid crystal display panel is provided, which comprises an array substrate as stated above, and further comprises a counter substrate and a liquid crystal layer 12 between the array substrate and the counter substrate. The pixel electrode 28 and the common electrode 4 are adapted to form an electric field to drive liquid crystal molecules of the liquid crystal layer to rotate.

According to a fourth aspect of the disclosure, a display device is provided, which can comprise a liquid crystal display panel as stated above.

Although the disclosure has been described by making reference to embodiments that have been considered currently, it should be understood that the disclosure is not limited to the disclosed embodiments. On the contrary, the disclosure intends to cover various modifications and equivalents within the spirit and the scope of the attached claims. The scopes of the following claims comply with the most extensive explanation so as to encompass each of such modifications and equivalent structures and functions.

The invention claimed is:

1. An array substrate, comprising:
a common electrode and a pixel electrode on a base substrate;
a passivation layer between the common electrode and the pixel electrode;
wherein the pixel electrode is a grating structure comprising a plurality of sub-pixel electrodes, and
wherein the sub-pixel electrode comprises a body structure extending in a first direction, and a bending structure extending in a second direction and formed at an end portion of at least one end of the body structure, and a protrusion is disposed at a joint of the body structure and the bending structure, wherein the bending structure comprises a first bending structure extending in the second direction and formed at an end portion of one end of the body structure, and a second bending structure extending in the second direction and formed at an end portion of the other end of the body structure, and in that the protrusion is disposed at an outer side of joint of the body structure and the first bending structure of at least one of the sub-pixel electrodes, and/or the protrusion is disposed at an outer side of joint of the body structure and the second bending structure of at least one of the sub-pixel electrodes, the outer side of the joint of the body structure and the bending structure is a side of the joint opposite to a bending direction of the bending structure.

2. The array substrate as claimed in claim 1, wherein the plurality of sub-pixel electrodes are parallel with each other.

3. The array substrate as claimed in claim 1, wherein the protrusion is disposed at an outer side of joint of the body structure and the first bending structure of each of the sub-pixel electrodes, and at an outer side of joint of the body structure and the second bending structure of each of the sub-pixel electrodes.

4. The array substrate as claimed in claim 3, wherein the protrusion disposed at the outer side of the joint of the body structure and the first bending structure of each of the sub-pixel electrodes faces towards one direction, and the protrusion disposed at the outer side of the joint of the body structure and the second bending structure of each of the sub-pixel electrodes faces towards another direction, and in that the protrusion at the outer side of the joint of the body structure and the first bending structure of the sub-pixel electrode and the protrusion at the outer side of the joint of the body structure and the second bending structure of the sub-pixel electrode face towards opposite directions.

5. The array substrate as claimed in claim 1, wherein a profile of the protrusion is in $\Lambda$ shape or arc shape.

6. The array substrate as claimed in claim 1, wherein the common electrode is located under the pixel electrode.

7. The array substrate as claimed in claim 1, wherein the common electrode and the pixel electrode are both transparent electrically conductive film electrodes.

8. A method of manufacturing an array substrate, comprising the steps of:
forming a common electrode and a pixel electrode on a base substrate, and a passivation layer between the common electrode and the pixel electrode, wherein the pixel electrode is a grating structure comprising a plurality of sub-pixel electrodes, and the sub-pixel electrode comprises a body structure extending in a first direction, and a bending structure extending in a second direction and formed at an end portion of at least one end of the body structure, and
forming a protrusion at a joint of the body structure and the bending structure,
wherein the bending structure comprises a first bending structure extending in the second direction and formed at an end portion of one end of the body structure, and a second bending structure extending in the second direction and formed at an end portion of the other end of the body structure, and wherein the step of forming a protrusion at the joint of the body structure and the bending structure comprises:
forming a protrusion at an outer side of joint of the body structure and the first bending structure of at least one of the sub-pixel electrodes, and/or forming a protrusion at an outer side of joint of the body structure and the second bending structure of at least one of the sub-pixel electrodes, wherein the outer side of the joint of the body structure and the bending structure is a side of the joint opposite to a bending direction of the bending structure.

9. The method of manufacturing an array substrate as claimed in claim 8, wherein the plurality of sub-pixel electrodes are parallel with each other.

10. The method of manufacturing an array substrate as claimed in claim 8, wherein the step of forming a protrusion at the joint of the body structure and the bending structure comprises:
forming protrusions at an outer side of joint of the body structure and the first bending structure of each of the sub-pixel electrodes and at an outer side of joint of the body structure and the second bending structure of each of the sub-pixel electrodes.

11. The method of manufacturing an array substrate as claimed in claim 10, wherein the protrusion disposed at the outer side of the joint of the body structure and the first bending structure of each of the sub-pixel electrodes faces towards one direction, and the protrusion disposed at the outer side of the joint of the body structure and the second bending structure of each of the sub-pixel electrodes faces towards another direction, and wherein the protrusion at the outer side of the joint of the body structure and the first bending structure of the sub-pixel electrode and the protrusion at the outer side of the joint of the body structure and the second bending structure of the sub-pixel electrode face towards opposite directions.

12. The method of manufacturing an array substrate as claimed in claim 8, wherein a profile of the protrusion is in $\Lambda$ shape or arc shape.

13. The method of manufacturing an array substrate as claimed in claim 8, wherein the step of forming a common electrode and a pixel electrode on a base substrate comprises:
forming a common electrode on a base substrate and forming a pixel electrode above the common electrode.

14. The method of manufacturing an array substrate as claimed in claim 8, wherein the common electrode and the pixel electrode are both transparent electrically conductive film electrodes.

15. A liquid crystal display panel, comprising an array substrate as claimed claim 1, and further comprising a counter substrate and a liquid crystal layer between the array substrate and the counter substrate,
wherein the pixel electrode and the common electrode are adapted to form an electric field to drive liquid crystal molecules of the liquid crystal layer to rotate.

16. A display device, comprising a liquid crystal display panel as claimed in claim 15.

17. The array substrate as claimed in claim 2, wherein a profile of the protrusion is in $\Lambda$ shape or arc shape.

18. The array substrate as claimed in claim 1, wherein a profile of the protrusion is in $\Lambda$ shape or arc shape.

* * * * *